United States Patent [19]

Logan et al.

[11] Patent Number: 4,464,211

[45] Date of Patent: Aug. 7, 1984

[54] METHOD FOR SELECTIVE AREA GROWTH BY LIQUID PHASE EPITAXY

[75] Inventors: Ralph A. Logan, Morristown; Won-Tien Tsang, New Providence, both of N.J.

[73] Assignee: AT&T Bell Laboratories, Murray Hill, N.J.

[21] Appl. No.: 382,402

[22] Filed: May 26, 1982

[51] Int. Cl.$^3$ .................................... H01L 21/208
[52] U.S. Cl. ..................... 148/171; 148/172; 29/569 L
[58] Field of Search ............ 148/171, 172; 372/45, 372/46, 48; 29/569 L

[56] References Cited

U.S. PATENT DOCUMENTS

| | | | |
|---|---|---|---|
| 3,978,426 | 8/1976 | Logan et al. | 331/94.5 |
| 4,048,627 | 9/1977 | Ettenberg et al. | 372/46 |
| 4,176,325 | 11/1979 | Kajimura et al. | 372/45 |
| 4,194,933 | 3/1980 | Logan et al. | 148/171 |
| 4,269,635 | 5/1981 | Logan et al. | 372/48 X |
| 4,342,148 | 8/1982 | Springthorpe et al. | 148/171 X |
| 4,366,569 | 12/1982 | Hirao et al. | 372/46 |
| 4,371,968 | 2/1983 | Trussell et al. | 148/171 X |
| 4,384,398 | 5/1983 | Dutt | 29/569 L |

OTHER PUBLICATIONS

Tsang, Logan and van der Ziel, Applied Physics Letters, vol. 40, No. 11, Jun. 1, 1982, pp. 942-944.
W. T. Tsang, "A New Current-Injection Heterostructure Laser: The Double-Barrier Double-Heterostructure Laser," *Applied Physics Letters*, 38, (11), Jun. 1, 1981, pp. 835-837.

*Primary Examiner*—G. Ozaki
*Attorney, Agent, or Firm*—Richard D. Laumann

[57] ABSTRACT

A lateral selective area liquid phase epitaxy method useful for the fabrication of, for example, a double barrier buried heterostructure laser, is described.

7 Claims, 2 Drawing Figures

METHOD FOR SELECTIVE AREA GROWTH BY LIQUID PHASE EPITAXY

TECHNICAL FIELD

This invention relates generally to methods for liquid phase epitaxy and particularly to such methods that are selective in the area and materials on which they grow epitaxial layers.

BACKGROUND OF THE INVENTION

Many modern technological applications require high quality crystals for use in, for example, semiconductor and optical devices. Accordingly, many crystal growth techniques have been developed and brought to a high degree of perfection.

One technique of particular interest for growth of semiconductor devices such as, for example, lasers and photodetectors, is liquid phase epitaxy (LPE). In this technique, a boat, typically comprising carbon, holding a semiconductor wafer is placed under a melt containing semiconductor material. Prior to contact with the wafer or substrate, the solution is saturated or slightly undersaturated and has an initial temperature, T. The temperature of the melt is now decreased after contact with the substrate and epitaxial growth begins. After the desired amount of epitaxial growth has occurred, the wafer with the epitaxial layer is removed from contact with the solution by sliding the boat. Further layers may be grown with varying thicknesses, compositions, etc.

Most LPE growth techniques are directed toward obtaining uniform growth, i.e., obtaining growth on all areas contacted by the melt. However, selective area liquid phase epitaxy techniques are known and useful. One prior art selective area growth technique using LPE involved the use of a dielectric film deposited on a GaAs surface of a dielectric insert to serve as a mask. In this technique, no epitaxial layer will grow over the masked surface while an epitaxial layer grows over the unmasked surface. For a more detailed description of this technique, see, for example, U.S. Pat. No. 3,978,426 issued on Aug. 31, 1976 to R. A. Logan et al.

SUMMARY OF THE INVENTION

We have found a new lateral selective area growth technique that uses liquid phase epitaxy. The method comprises contacting a structure comprising a first semiconductor material comprising at least one constituent and a second semiconductor material comprising at least two constituents with a growth solution or melt. The growth solution comprises at least two constituents of the first and second materials. The temperature is raised and there is initially a thermodynamic nonequilibrium state resulting in dissolution of the crystal surface and the formation of a boundary layer in the growth solution and subsequent growth of a thin graded composition as the temperature is lowered. The temperature should be raised at least 0.1 degree C. and the subsequent decrease is less than the increase. The growth follows dissolution as one material from the bulk of the liquid will diffuse rapidly into the boundary layer. In one preferred embodiment, the first material comprises GaAs and the second material comprises $Al_xGa_{1-x}As$ with x greater than approximately 0.15 and the melt comprises a Ga solution of AlGaAs. The method appears especially useful for growing structures comprising a constituent having a high distribution coefficient in the melt. As the structure is brought into contact with the melt containing the high distribution coefficient constituent, the boundary layer becomes depleted in this element and rich in another constituent relative to the bulk of the melt. Growth ensues as Al from the bulk of the liquid diffuses into the boundary layer. In yet another preferred embodiment, the method is used to grow a lateral double barrier buried heterostructure laser.

DETAILED DESCRIPTION

Figure 1:
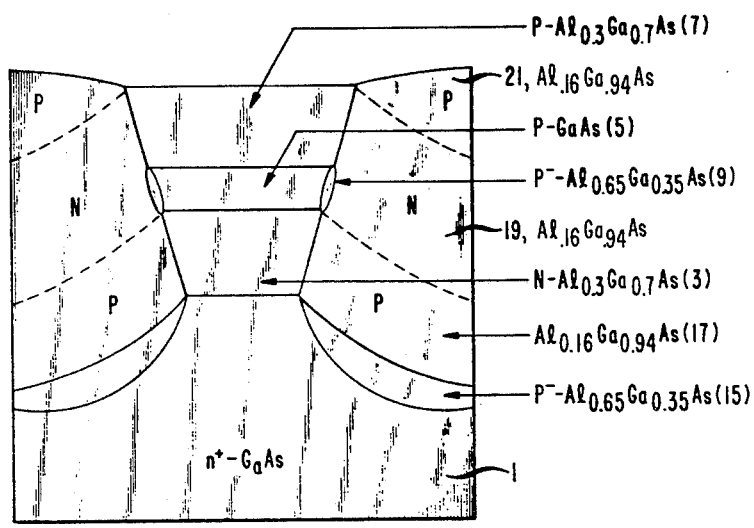
FIG. 1 is a schematic diagram of a lateral double barrier buried heterostructure laser fabricated by the method of this invention.

Our invention will be described by reference to fabrication of double barrier double heterostructure on a GaAs substrate. The structure is schematically illustrated in cross section in FIG. 1. The device comprises a substrate 1, a first epitaxial layer 3, a second epitaxial layer 5, a third epitaxial layer 7, and two barrier layers 9. The structure further comprises burying layers 15, 17, 19, and 21. The first epitaxial layer has a first conductivity type and the third epitaxial layer has a second conductivity type. The second epitaxial layer is the active layer and may be either first or second conductivity type. Burying layers 15, 17, and 21 have a second conductivity type and burying layer 19 has a first conductivity type. In a preferred embodiment, the first conductivity type is n-type and the second conductivity type is p-type. In a further preferred embodiment, the first and third epitaxial layers comprise $Al_{0.3}Ga_{0.7}As$ and the second epitaxial layer comprises GaAs. The barrier layer and the first burying layer comprise $Al_{0.65}Ga_{0.35}As$ and the additional burying layers comprise $Al_{0.16}Ga_{0.84}As$. The GaAs layer is thus the semiconductor material comprising at least one constituent and the $Al_{0.3}Ga_{0.7}As$ layers are thus the semiconductor material comprising at least two constituents. The mesa, which had a stripe width of approximately 3 μm, was formed by selective chemical etching, using known techniques, into the GaAs substrate. The regrowth steps, i.e., growth of the burying and barrier layers, consisted of the selective growth described in the next paragraph followed by regrowth of $Al_yGa_{1-y}As$ with a composition factor y selected to form $x_c - x_{eff}$ approximately equal to 0.01 to ensure single mode operation of the laser so fabricated. It is to be understood that nominal amounts of both undesired impurities and desired dopants may be present. The latter layers were grown from p-type and n-type melts to provide current confinement. The operation of the double barrier double heterostructure laser, which was invented by W. T. Tsang, is described in *Applied Physics Letters*, 38, pp. 835–838, 1981.

The double barrier double heterostructure laser reduces beam divergence of the laser without degrading the confinement of carriers in the active layer. Hence, the device characteristics are stabilized and lasing can occur with increasing operating temperature. The presence of the barrier layers ensures minimal lateral carrier leakage out into the burying layers at high temperatures in situations when the composition factor $x_b$ of the burying layer is $x_b$ less than or equal to approximately 0.2. To form a lowest order mode optical cavity in devices such as the buried heterostructure, the buried optical guide, and the stripe buried heterostructure lasers, it is desirable to have the $x_b$ of the burying layer only very slightly higher than the effective value of the effective refractive index of the mesa layers transverse to the junction. The small refractive index difference allows fundamental mode operation in the lateral direction with reasonably wide stripes and narrow beam divergence as well as reduced optical scattering losses due to side wall roughness of the etched mesas.

The selective regrowth was reproducibly achieved by placing the GaAs substrate with the above-described etched multilayer mesas on the surface under the $Al_{0.65}Ga_{0.35}As$ melt at a constant temperature of approximately 750 degrees C. The furnace temperature was then increased approximately 1 degree to improve wetting by a melt back estimated as being no more than 0.2 $\mu m$. As the furnace temperature is adjusted, i.e., increased, a very slight overshoot, that is, an increase greater than desired, in the furnace temperature occurs which causes a melt back on the rise in the temperature and regrowth on the subsequent very slight decrease, less than 1 degree C., in the temperature. The increase should be at least 0.1 degree C. Thus, the temperature is first raised and then lowered to obtain the desired selective growth. After approximately 6 minutes, but before the furnace temperature is completely equilibrated, the wafer was placed under the second melt comprising $Al_{0.16}Ga_{0.24}As$ and the furnace cooling was initiated at a rate of approximately 0.4 degrees C./min and the remaining regrowth, i.e., the growth of burying layers 17, 19, and 21, was formed in the usual manner. The sample was then cleaned, metallized, and cleaved to form the standard laser chips. The initial preferential growth of the $Al_{0.65}Ga_{0.35}As$ over the GaAs surfaces in both the active stripe side walls and the etched GaAs substrate was clearly apparent in scanning electron microscope cross sections examined by scanning electron microscope photographs. As the selective growth occurs only briefly, the barrier layers, i.e., layers 9, are very thin but are alongside the entire length of the sidewalls of the active stripe. This lateral selective area growth may be achieved in wafers with thickness as thin as 0.15 $\mu m$. Additionally, the barrier layers are generally very uniform in shape and in thickness over the wafer and they are symmetrical with respect to a vertical line through the center of the mesa.

The selective growth, i.e., the barrier layers and layer 15, results because of the initial nonequilibrium state of both the GaAs and the $Al_xGa_{1-x}As$ surfaces when they are contacted initially with the growth solution. Due to the nonequilibrium state, the thermodynamics of the system results in dissolution of the crystal surface with a resulting formation of a boundary layer in the melt adjacent to the crystal surface followed by growth of a thin graded compositional layer. For GaAs in contact with the Al-containing solution, the boundary layer is depleted in Al and rich in As relative to the bulk of the solution. The increase in temperature enhances this situation. Growth follows the initial dissolution as Al from the bulk of the liquid diffuses rapidly into the boundary layer. If the initial semiconductor surface comprises Al, the amount of dissolution and regrowth will be small since the high Al distribution coefficient for the Al-Ga-As system requires that the boundary layer solution be rapidly saturated. The distribution coefficient, which is the ratio of the composition in the solid to that in the liquid, is desirably high for at least one constituent. The distribution coefficient for Al is approximately 100.

Although described specifically with respect to fabrication of a DBDH laser, our method may be used to fabricate other devices. The cross section of the barrier layers is almost invariably lens-like, i.e., has a nonplanar surface, and consequently, devices grown by our method can be used to form integrated astigmatic, approximately cylindrical lenses at the mirror ends of etched cavity lasers. Furthermore, integrated cylindrical lenses at the end of the etched cavity lasers may have their focal lengths controlled by the growth times. The integrated cylindrical lens will then modify the beam divergence in the vertical direction. If the $Al_{0.16}Ga_{0.84}As$ burying layer is omitted, a reflective film coated over the cylindrical lens would further reduce the threshold of the etched cavity lasers.

Figure 2:
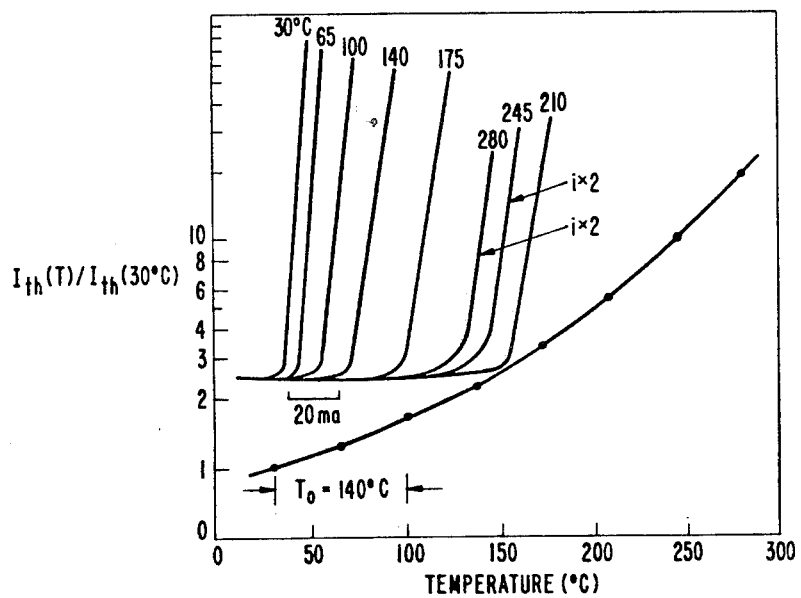
FIG. 2 is a plot of the temperature dependence of the threshold current for a laser according to FIG. 1 with the temperature in degrees C. being plotted horizontally and the threshold current being plotted vertically.

FIG. 2 shows the temperature dependence of the pulsed threshold current of a double barrier double heterostructure laser fabricated according to this invention. The inset shows the L-I characteristics. The diodes operated at temperatures as high as 280 degrees C. with the threshold current of 340 mA and represent the highest temperature any buried heterostructure laser is operated at. Clear fundamental mode operation was observed with a half-power full width of approximately 18 degrees. The difference in refractive inclines between the mesa and the burying layers is small and consequently, optical scattering losses due to the side wall roughness of the mesa are reduced. This was evidenced by the absence of structure in the far field pattern observed in loss stabilized buried optical guide lasers.

Although described with respect to the growth of structures having AlGaAs layer grown on GaAs, it is to be understood that our method may be used with other materials systems.

What is claimed is:

1. A method of fabricating a device comprising the step of selectively growing at least one epitaxial layer, said growing step comprising the steps of contacting a first semiconductor material comprising at least one constituent and a second semiconductor material comprising at least two constituents with a growth solution; said growth solution comprising at least two constituents of said first and said second semiconductor materials; said materials being in nonequilibrium with said solution;

raising the temperature of said system followed by subsequent lowering of the temperature whereby growth selectively occurs on said first material.

2. A method as recited in claim 1 in which at least one of said semiconductor materials comprises a high distribution coefficient constituent.

3. A method as recited in claim 2 in which said constituent is Al.

4. A method as recited in claim 3 in which said first material comprises GaAs.

5. A method as recited in claim 4 in which said second material comprises $Al_xGa_{1-x}As$.

6. A method as recited in claim 5 in which x is less than or equal to approximately 0.3.

7. A method as recited in claim 1 in which said raising step increases the temperature by at least approximately 0.1 degree C.

* * * * *